(12) United States Patent
Jeter et al.

(10) Patent No.: US 6,943,293 B1
(45) Date of Patent: Sep. 13, 2005

(54) HIGH POWER ELECTRONIC PACKAGE WITH ENHANCED COOLING CHARACTERISTICS

(75) Inventors: Michael A Jeter, Kokomo, IN (US); Ralph S. Taylor, Noblesville, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/931,667

(22) Filed: Sep. 1, 2004

(51) Int. Cl.[7] ............................................... H05K 7/20
(52) U.S. Cl. .................... 174/52.1; 361/688; 361/704; 257/706
(58) Field of Search ............................... 174/52.1, 52.2, 174/52.3, 52.4; 361/688, 704, 707, 708, 709, 361/714, 715, 717; 257/706, 712, 713

(56) References Cited

U.S. PATENT DOCUMENTS

| | | | |
|---|---|---|---|
| 5,410,451 A | * | 4/1995 | Hawthorne et al. ......... 361/760 |
| 5,940,271 A | * | 8/1999 | Mertol ........................ 361/704 |
| 6,563,712 B2 | * | 5/2003 | Akram et al. ................ 361/719 |
| 6,845,012 B2 | * | 1/2005 | Ohkouchi .................... 361/704 |
| 6,873,043 B2 | * | 3/2005 | Oman ......................... 257/703 |

* cited by examiner

Primary Examiner—Dean A. Reichard
Assistant Examiner—Carmelo Oliva
(74) Attorney, Agent, or Firm—Stefan V. Chmielewski

(57) ABSTRACT

A power electronics module includes a heat sink and an electronic package having a first layer in direct thermal communication with the heat sink. At least one electronic component is disposed between the first layer and a second layer. A thermally conductive element is in direct thermal communication with the second layer and carries heat from a first portion of the second layer to a second portion of the second layer such that the heat is transferred from the second portion of the second layer to the heat sink through the first layer.

20 Claims, 3 Drawing Sheets

HIGH POWER ELECTRONIC PACKAGE WITH ENHANCED COOLING CHARACTERISTICS

BACKGROUND OF THE INVENTION

Electronic packages are used in many high power applications. For example, hybrid electric vehicles traditionally use power electronics modules, sometimes in the form of "inverters," including electronic packages containing wire bonded power switches. The modules are relatively large and costly. A major cost driver for power electronics is the number and size of the power switches used.

The number and size of the power switches required for a specific application may be determined by the power requirements of the application and the level of power density that each power switch is capable of carrying. The power-carrying capability of the power switches is limited by the rate at which heat may be dissipated from the power switches. Overheating of power switches, and electronics in general, is well known to cause a variety of performance problems in the device.

What is needed in the art is a method of increasing the heat dissipating ability of high power electronic packages. With a higher level of heat dissipation, it may be possible to reduce the number of power packages used in a device, thereby reducing the size and cost of the device. Alternatively, or additionally, it may be possible to increase the power output of the device, thereby improving its performance.

SUMMARY OF THE INVENTION

The present invention provides a high power electronic package having improved thermal paths which enable the package to dissipate heat at an increased rate.

In one form, the present invention comprises a power electronics module including a heat sink and an electronic package having a first layer in direct thermal communication with the heat sink. At least one electronic component is disposed between the first layer and a second layer. A thermally conductive element is in direct thermal communication with the second layer and carries heat from a first portion of the second layer to a second portion of the second layer such that the heat is transferred from the second portion of the second layer to the heat sink through the first layer.

In another form, the present invention comprises an electronic package including a first layer radiating heat from the package. At least one electronic component is disposed between the first layer and a second layer. A thermally conductive element is in direct thermal communication with the second layer and carries heat from a first portion of the second layer to a second portion of the second layer such that the heat is transferred from the second portion of the second layer to the heat sink through the first layer.

An advantage of the present invention is that the electronic package can dissipate heat at an increased rate, thereby enabling the package to output more power without a loss of performance.

BRIEF DESCRIPTION OF THE DRAWINGS

The above-mentioned and other features and objects of this invention, and the manner of attaining them, will become more apparent and the invention itself will be better understood by reference to the following description of embodiments of the invention taken in conjunction with the accompanying drawings, wherein:

FIG. 1b is an enlarged view of one of the electronic packages of the power board assembly of the power electronics module of FIG. 1a;

FIG. 2 is an exploded view of the electronic package of FIG. 1b and a portion of the heat exchanger of FIG. 1a; and FIG. 3 is a fragmentary, schematic, side view of the heater exchanger, power board assembly and biasing device of FIG. 1a.

Figure 1B:
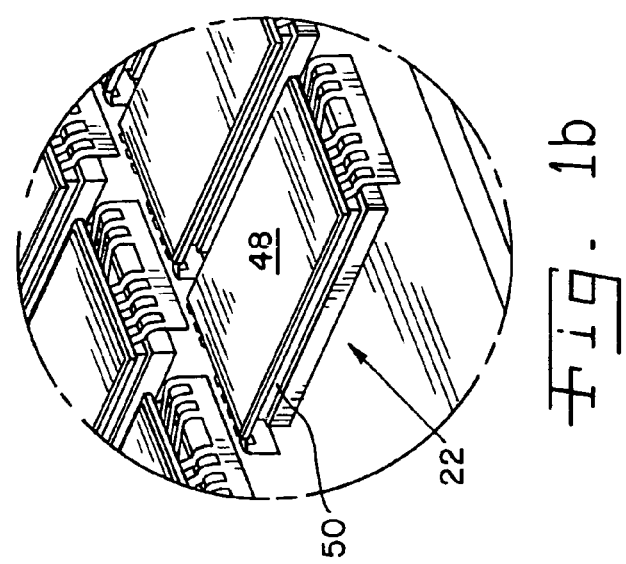

Corresponding reference characters indicate corresponding parts throughout the several views. Although the drawings represent embodiments of the present invention, the drawings are not necessarily to scale and certain features may be exaggerated in order to better illustrate and explain the present invention. The exemplifications set out herein illustrate embodiments of the invention in several forms and such exemplification is not to construed as limiting the scope of the invention in any manner.

DESCRIPTION OF INVENTION

The embodiments discussed below are not intended to be exhaustive or limit the invention to the precise forms disclosed in the following detailed description. Rather, the embodiments are chosen and described so that others skilled in the art may utilize their teachings.

Figure 1A:
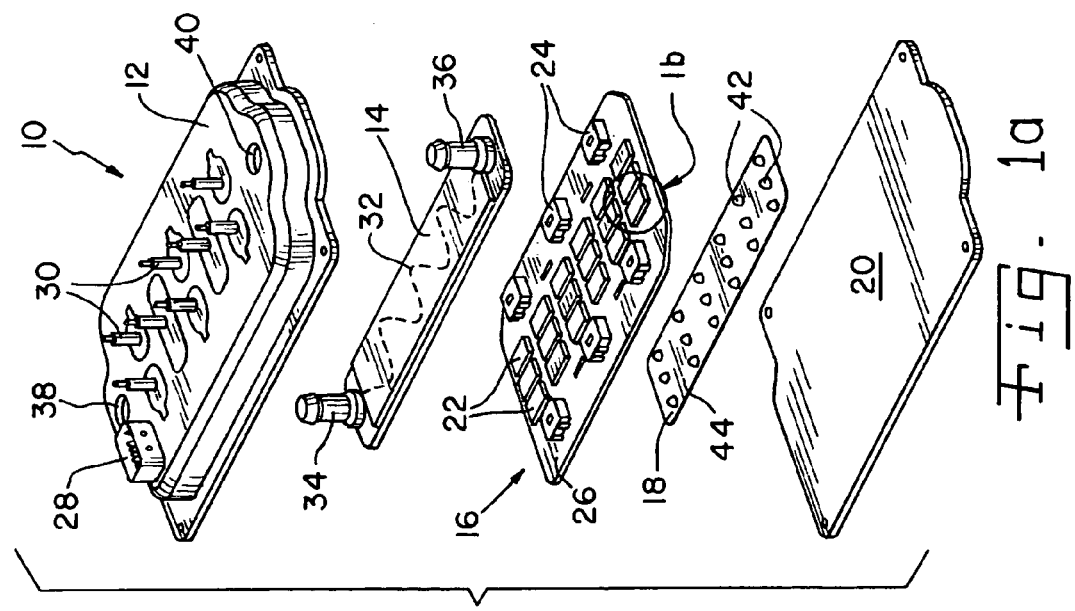
FIG. 1a is one embodiment of a power electronics module of the present invention.

One embodiment of a power electronics module 10 of the present invention is shown in FIG. 1a. Module 10 includes a housing 12, a heat sink in the form of heat exchanger 14, a power board assembly 16, a biasing device 18, and a base 20. Heat exchanger 14, power board assembly 16 and biasing device 18 may be received in housing 12, and housing 12 may be attached to base 20 to form a container for protecting heat exchanger 14, power board assembly 16 and biasing device 18 therein.

Power board assembly 16 includes an array of electronic packages 22 and input/output (I/O) devices 24 disposed on a circuit board 26. Packages 22 may be in electrical communication with each other and/or with I/O devices 24 via electrically conductive traces (not shown) in circuit board 26. I/O devices 24 may be in electrical communication with I/O devices on housing 12, including communication port 28 and high power connectors 30.

Heat exchanger 14 may include an internal fluid channel 32 fluidly interconnecting an input fluid port 34 and an output fluid port 36, which are received through respective throughholes 38, 40 in housing 12. Fluid channel 32 may be arranged in a serpentine path as shown. Heat exchanger 14 may engage, i.e., physically contact, electronic packages 22 in order to create thermal paths from packages 22 to heat exchanger 14, as discussed in more detail below. Alternatively, there may not be contact between heat exchanger 14 and electronic packages 22 because of the use of a thermal interface material between heat exchanger 14 and electronic packages 22. Heat exchanger 14 may be formed of aluminum or some other material that has good thermal conduction properties.

Biasing device 18 includes an array of projections in the form of bumps 42 projecting from a substrate 44, which is supported by base 20. Each of bumps 42 engages and biases a respective one of electronic packages 22 against heat exchanger 14 to thereby improve the thermal path from the package 22 to heat exchanger 14. Biasing device 18 may be formed of some resilient material such as metal or rubber, for example. In one embodiment, base plate 20 is die cast of aluminum.

Figure 2:
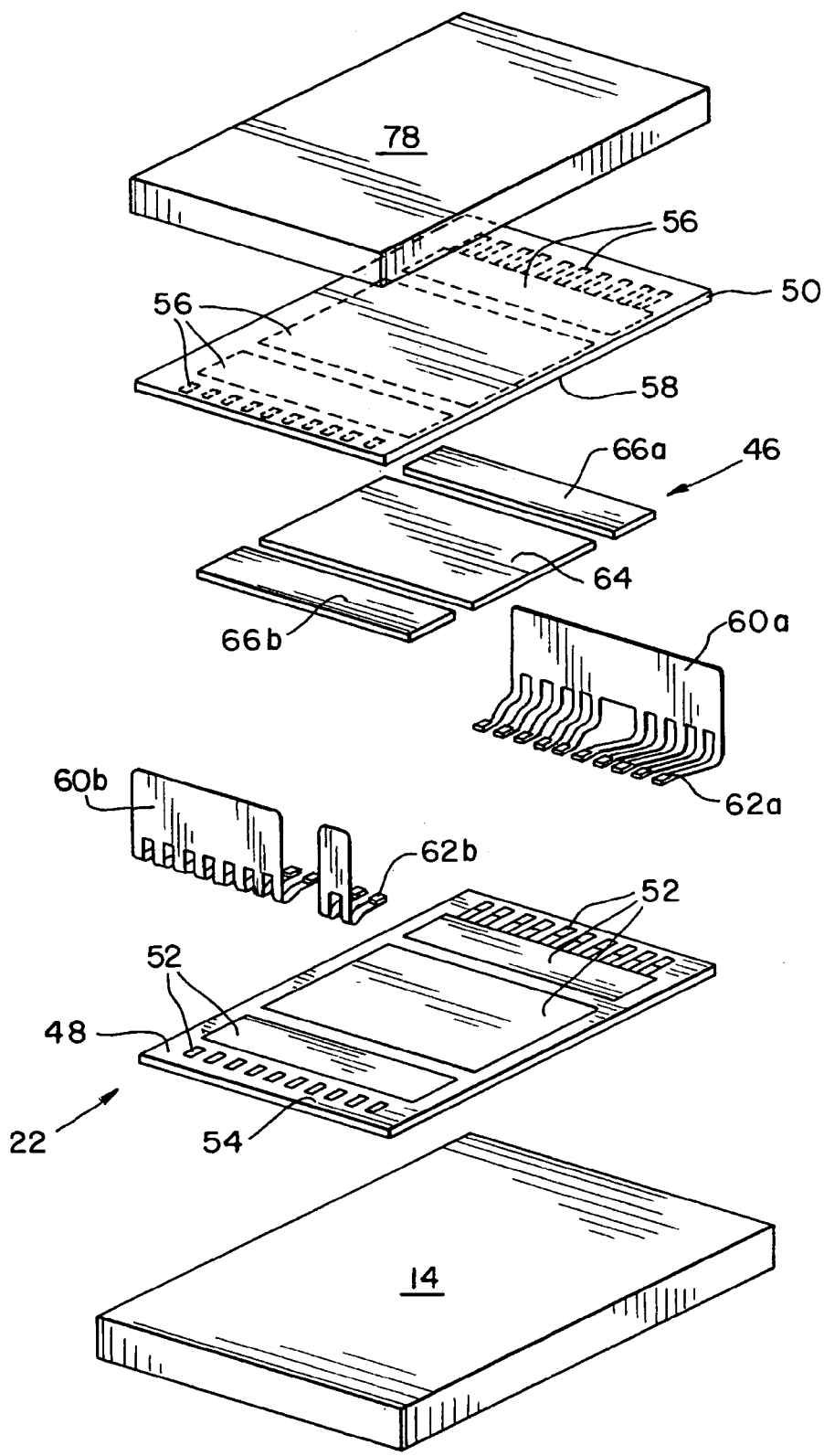

An enlarged view of area 1b in FIG. 1a is shown in FIG. 1b. Package 22 includes electronic components 46 (FIG. 2) sandwiched between and thermally connected to a first layer in the form of a base plate 48 and a second layer in the form of a cover 50. Base plate 48 and cover 50 may be formed of ceramic or any other thermally conductive dielectric. Components 46 may be thermally connected to plate 48 and cover 50 by physical contact, by a small air gap, by solder, or by any other thermally conductive material. The term "cover" as used herein is broad enough to encompass embodiments including an over-molded package. Base plate 48 may include electrically conductive contacts 52 exposed on a surface 54 facing electronic components 46. Similarly, cover 50 may include electrically conductive contacts 56 exposed on a surface 58 facing electronic components 46.

Package 22 also includes lead frames 60a, 60b having respective leads 62a, 62b soldered or otherwise electrically connected to contacts 52 and/or contacts 56. Lead frames 60a, 60b may be formed of copper or any other electrically conductive material. Similarly to electronic components 46, lead frames 60a, 60b may be thermally connected to plate 48 and cover 50 by physical contact, by thermal interface material, by solder, or by any other thermally and electrically conductive material. Contacts 52, 56 may electrically connect electronic components 46 to lead frames 60a, 60b and may possibly connect individual ones of electronic components 46 to one or more other ones of electronic components 46.

Electronic components 46 may include high power components that produce a high level of heat. In the embodiment shown, electronic components 46 include a heat-producing insulated gate bipolar transistor (IGBT) 64. Electronic components 46 may also include diodes 66a, 66b disposed at opposite ends of IGBT 64. Diodes 66a, 66b may be electrically connected to IGBT 64 and/or to each other.

Plate 48 and cover 50 may be formed of a material having a coefficient of thermal expansion (COE) that is substantially matched to the COE of electronics 46 in order to prevent stress in the solder joints between contacts 52, 56, leads 62a–b and electronics 46. Such stress could lead to cracks in the solder joints and deterioration in the performance of the device.

Base plate 48 and cover 50 may be formed of identical or substantially similar materials. For example, the bodies of plate 48 and cover 50 may both be ceramic substrates formed of a material having a COE substantially matched to the COE of the silicon of which IGBT 64 and diodes 66a, 66b are formed. In one embodiment, the ceramic substrates of plate 48 and cover 50 are formed of aluminum nitride and/or silicon nitride. Contacts 52, 56 may be formed, for example, of copper or aluminum, and may be direct bonded to plate 48 and cover 50, respectively.

Figure 3:
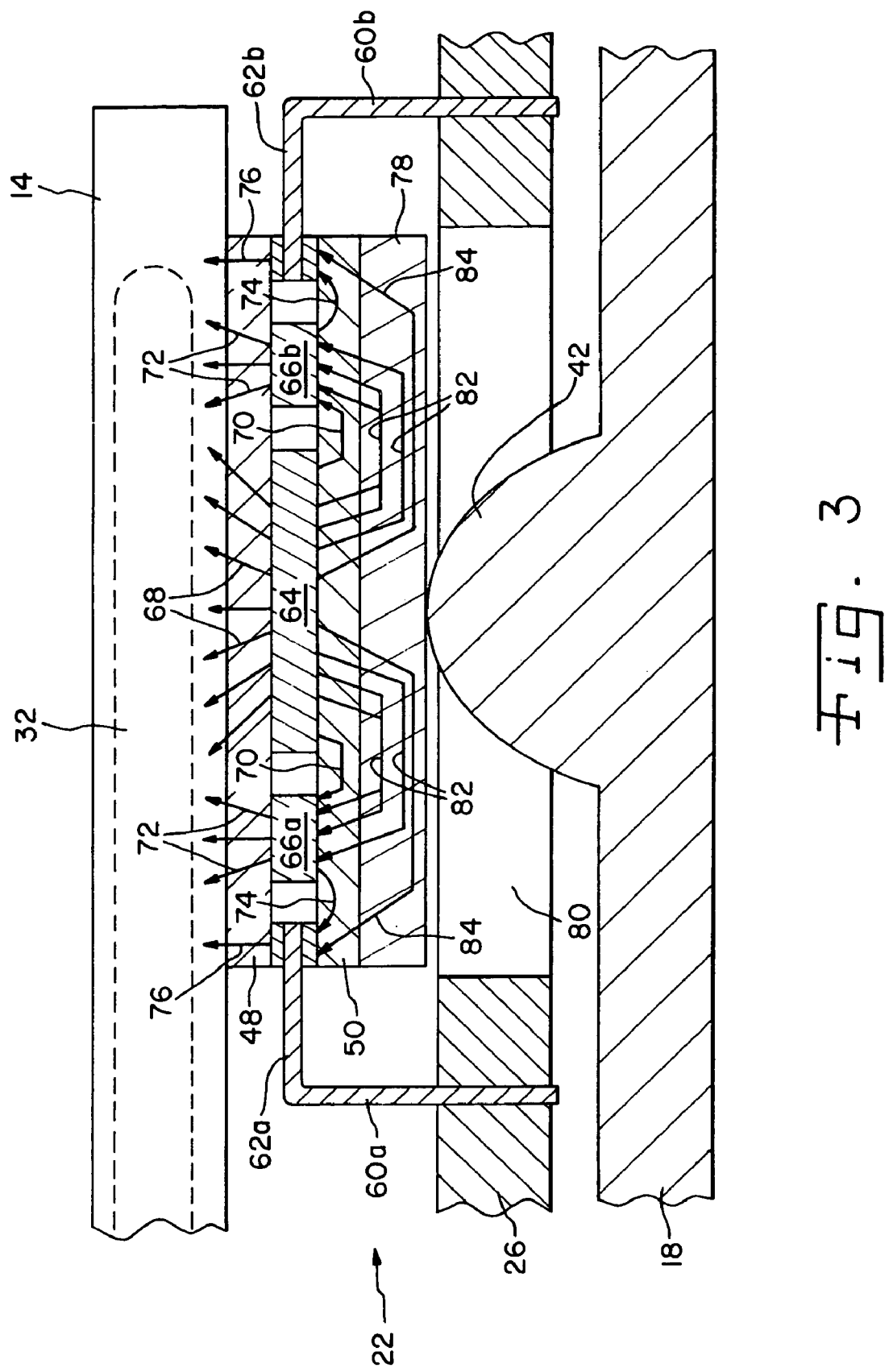

The thermal paths through electronic package 22 to heat exchanger 14 are illustrated in FIG. 3. A primary thermal path from the heat-producing IGBT 64 to heat exchanger 14 is indicated by arrows 68 as leading from IGBT 64 directly through base plate 48 to heat exchanger 14. There may be an interface material between base plate 48 and heat exchanger 14. A secondary thermal path from the heat-producing IGBT 64 to heat exchanger 14 is indicated by arrows 70 and 72 as leading from IGBT 64 to diodes 66a–b through cover 50, and from diodes 66a–b to exchanger 14 through base plate 48. Another secondary thermal path from the heat-producing IGBT 64 to heat exchanger 14 is indicated by arrows 70, 74 and 76 as leading from IGBT 64 to diodes 66a–b through cover 50, from diodes 66a–b to leads 62a–b through cover 50, and through base plate 48 to exchanger 14. Non-heat-producing electronics such as diodes 66a–b and lead frames 60a–b may be distributed or arranged between and around heat-producing electronics such as IGBT 64 in order to improve the thermal conductivity of the secondary thermal paths.

For improved heat dissipation from IGBT 64 to heat exchanger 14 through the secondary thermal paths, cover 50 would ideally be formed of a material having good heat conductivity, i.e., a high coefficient of heat conductivity. However, the need to avoid solder joint stress by matching the COEs of plate 48 and cover 50 with the COEs of electronics 46 prohibits forming cover 50 of a material having a high coefficient of heat conductivity. That is, there is no known material having both a COE that matches the COE of the silicon electronics 46 and a high coefficient of heat conductivity.

According to the present invention, electronic package 22 is provided with a thermally conductive element in the form of a thermally conductive cap 78 that is physically and thermally attached to cover 50. Cap 78 may be in direct thermal communication with cover 50 and may have a coefficient of thermal conductivity that is greater than that of the body of cover 50. A layer of thermal grease (not shown), or any other thermally conductive interface material, may be provided between cap 78 and cover 50 and/or between heat exchanger 14 and plate 48. Cap 78 may be formed of any thermally conductive material, such as copper or another metal.

As shown in FIG. 3, circuit board 26 includes a through-hole 80 through which bump 42 may engage cap 78 to thereby bias package 22 against heat exchanger 14. Thus, plate 48 is thermally attached to heat exchanger 14 and the thermal conductivity from plate 48 to heat exchanger 14 is improved. Circuit board 26 may include a plurality of throughholes 80 each aligned with and allowing contact between a respective bump 42 and a respective package 22.

In operation, cap 78 reduces the thermal resistance of the secondary thermal paths between IGBT 64 and heat exchanger 14 without being connected, i.e., being disconnected, from heat exchanger 14. As shown in FIG. 3, cap 78 provides additional secondary thermal paths 82 and 84 to diodes 66a–b and leads 62a–b, respectively. Via thermal paths 82, 84, cap 78 carries heat from a portion of cover 50 that is adjacent IGBT 64 to portions of cover 50 that are adjacent diodes 66a–b and leads 62a–b. From these portions of cover 50 that are adjacent diodes 66a–b and leads 62a–b, the heat may then be transferred to heat exchanger 14 through diodes 66a–b, leads 62a–b and plate 48.

As described above, cap 78 is effective in dispersing heat from the portion of cover 50 that is adjacent IGBT 64 to other portions of cover 50 so that the heat may be better dissipated from package 22. In other embodiments, the thermal cap may be extended such that the cap physically engages leads 62 and/or plate 48. Thus, the cap, by virtue of its high thermal conductivity, may more effectively disperse the heat of IGBT 64 by carrying the heat directly to leads 62 and/or plate 48.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A power electronics module, comprising:
   a heat sink; and
   an electronic package including:
   a first layer in direct thermal communication with said heat sink;
   a second layer;
   at least one electronic component disposed between said first layer and said second layer; and
   a thermally conductive element in direct thermal communication with said second layer and configured to carry heat from a first portion of said second layer to a second portion of said second layer such that the heat is transferred from said second portion of said second layer to said heat sink through said first layer.

2. The module of claim 1, wherein said thermally conductive element is disconnected from said heat sink.

3. The module of claim 1, wherein said at least one electronic component is configured to produce the heat.

4. The module of claim 1, further comprising at least one electrical conductor disposed between said first layer and said second layer, wherein said at least one electronic component comprises a plurality of electronic components, the heat transferring from said second portion of said second layer to said first layer through at least one of said electrical conductor and said electronic components.

5. The module of claim 1, wherein said second layer includes a body formed of a material having a coefficient of thermal expansion substantially matched to a coefficient of thermal expansion of said electronic component.

6. The module of claim 5, wherein a coefficient of thermal conductivity of said thermally conductive element is greater than a coefficient of thermal conductivity of said body of said second layer.

7. The module of claim 5, wherein said second layer includes an electrical conductor electrically connected to said electronic component.

8. The module of claim 1, wherein said second layer includes a body formed of a ceramic material.

9. The module of claim 1, wherein said electronic component is silicon based.

10. The module of claim 1, further comprising a plurality of additional electronic packages, said heat sink being in direct thermal communication with each of said additional electronic packages.

11. An electronic package, comprising:
    a first layer configured to radiate heat from said package;
    a second layer;
    at least one electronic component disposed between said first layer and said second layer; and
    a thermally conductive element in direct thermal communication with said second layer and configured to carry heat from a first portion of said second layer to a second portion of said second layer such that the heat is transferred from said second portion of said second layer to said heat sink through the first layer.

12. The package of claim 11, wherein said first layer is configured to engage a heat sink.

13. The package of claim 11, wherein said at least one electronic component is configured to produce the heat.

14. The package of claim 11, further comprising at least one electrical conductor disposed between said first layer and said second layer, wherein said at least one electronic component comprises a plurality of electronic components, the heat transferring from said second portion of said second layer to said first layer through at least one of said electrical conductor and said electronic components.

15. The module of claim 11, wherein said second layer includes a body formed of a material having a coefficient of thermal expansion substantially matched to a coefficient of thermal expansion of said electronic component.

16. The module of claim 15, wherein a coefficient of thermal conductivity of said thermally conductive element is greater than a coefficient of thermal conductivity of said body of said second layer.

17. The module of claim 15, wherein said second layer includes an electrical conductor electrically connected to said electronic component.

18. The module of claim 11, wherein said second layer includes a body formed of a ceramic material.

19. The module of claim 11, wherein said electronic component is silicon based.

20. The module of claim 11, wherein said thermally conductive element is formed of metal.

* * * * *